United States Patent [19]
Narayanan

[11] 3,993,961
[45] Nov. 23, 1976

[54] OVERCOMPENSATED FEEDFORWARD METHOD AND APPARATUS USING OVERDISTORTED MAIN AMPLIFIERS

[75] Inventor: Sundaram Narayanan, Salem, N.H.

[73] Assignee: Bell Telephone Laboratories, Incorporated, Murray Hill, N.J.

[22] Filed: Oct. 31, 1975

[21] Appl. No.: 627,388

[52] U.S. Cl. .............................. 330/149; 330/151
[51] Int. Cl.$^2$ ....................................... H03F 1/28
[58] Field of Search ............ 330/30 R, 124 R, 149, 330/151; 328/163; 325/474–476

[56] References Cited
UNITED STATES PATENTS

| | | | |
|---|---|---|---|
| 1,686,792 | 10/1928 | Black | 179/171 |
| 2,592,716 | 4/1952 | Lewis | 179/171 |
| 2,776,410 | 1/1957 | Guanella | 333/28 |
| 3,202,928 | 8/1965 | Paior | 330/124 |
| 3,471,798 | 10/1969 | Seidel | 330/149 |
| 3,541,467 | 11/1970 | Seidel | 330/124 |
| 3,649,927 | 3/1972 | Seidel | 330/124 |
| 3,667,065 | 5/1972 | Beurrier et al. | 330/124 R |
| 3,725,806 | 4/1973 | Darlington | 330/149 |
| 3,815,040 | 6/1974 | Seidel | 330/149 |
| 3,873,936 | 3/1975 | Cho | 330/124 R |
| 3,886,470 | 5/1975 | O'Neil et al. | 330/149 |

*Primary Examiner*—James B. Mullins
*Attorney, Agent, or Firm*—Erwin W. Pfeifle

[57] ABSTRACT

Method and apparatus are disclosed to permit an advantageous reduction in the cost and size of a compensating conventional or parallel feedforward amplifier. By adjusting the main power amplifier to generate a distortion component which is greater than normally generated by the main power amplifier in prior art conventional or parallel feedforward amplifiers, the amplification factor of the auxiliary power amplifier in the conventional feedforward amplifier or the amplification factor of the auxiliary power amplifier and the attenuation factor in the interstage coupler in the parallel feedforward amplifier can be relaxed.

7 Claims, 4 Drawing Figures

OVERCOMPENSATED FEEDFORWARD METHOD AND APPARATUS USING OVERDISTORTED MAIN AMPLIFIERS

BACKGROUND OF THE INVENTION

The present invention relates to overcompensated feedforward amplification method and apparatus and, more particularly, to method and apparatus for providing substantially distortion-free amplification of input signals in overcompensated feedforward amplifier arrangements using overdistorted main amplifiers.

In wideband coaxial cable transmission systems in which the signal must pass through a large number of repeater stages between transmitting and receiving stations, the distortion generated by the power amplifying stages in each repeater plays a significant role in the degradation of signal quality. It is desired, therefore, to keep the distortion generated at each repeater stage as low as possible.

Prior art feedforward amplifier techniques, such as disclosed by H. Seidel in U.S. Pat. No. 3,471,798 issued Oct. 7, 1969, reduce the distortion generated by the power amplifying stage. In the Seidel patent, an input signal is divided into two portions, one portion of the signal being coupled to a main power amplifier that introduces distortion due to its nonlinearity with the remaining portion being coupled to a parallel second signal path. The amplified signal in the first signal path, comprising a linear and distortion component, is attenuated and combined with the undistorted signal in the second signal path such that the linear signal components cancel. The resultant signal, comprising solely a distortion component, is reamplified by an auxiliary power amplifier to produce a distortion signal equal in magnitude to the distortion component at the output of the main power amplifier. When this distortion signal at the output of the auxiliary amplifier is combined with the linear and distortion components at the output of the main power amplifier, the distortion components are cancelled. The resultant feed-forward amplifier output signal is thus representative of the distortion-free linear component at the output of the main amplifier. Since, however, the auxiliary amplifier amplifies only a distortion component, the magnitude of the feedforward output signal is determined by the amplification factor of the main power amplifier and the signal loss in the output coupler. Thus, since the auxiliary amplifier does not contribute to the feedforward amplifier power output, the output power is thus limited by the power output capabilities of the main power amplifier, and is less than the output power of the main amplifier, due to the signal loss in the output coupler.

In U.S. Pat. No. 3,725,806 issued Apr. 3, 1973 to S. Darlington, a distortion reducing amplifier is disclosed in which an auxiliary network generates a compensating signal comprising both linear and distortion components. When, however, the linear and distortion components in the auxiliary network are combined with the linear and distortion components at the output of the main distortion producing power amplifying network to cancel the distortion components, the linear components are of such phase relationship that the resultant linear component is less than the linear component at the output of the main power amplifying network. Therefore, the auxiliary network reduces the power output of the main power amplifying network.

In U.S. Pat. No. 3,873,936 issued on Mar. 25, 1975 to Y–S Cho, the distortion generated due to the nonlinear characteristics of the power amplifier in a repeater network is substantially reduced by generating a compensating signal in a feedforward amplifier network. In the feedforward network, an auxiliary power amplifier having substantially the same gain and distortion characteristics as the main power amplifier generates a compensating signal having a linear component and a distortion component equal in magnitude to the linear component and the distortion component, respectively, of the output signal of the main power amplifier. The phase relationship between the linear and distortion components at the output of the auxiliary amplifier is, however, opposite to the phae relationship between the linear and distortion components of the power amplifier. Thus, when the compensating signal is combined with the output of the main power amplifier, the distortion components are substantially cancelled and the linear components are added. The substantially distortion-free output signal, therefore, has greater power than was obtainable in prior art feedforward distortion reduction networks.

The ability to relax the requirements within components of the prior art overcompensated conventional or parallel feedforward amplifier arrangements, as shown generally in U.S. Pat. Nos. 3,471,798 and 3,873,936, respectively, for an advantageous reduction in repeater cost and size, while accomplishing the objectives of such arrangements, still remains a problem.

SUMMARY OF THE INVENTION

The present invention relates to overcompensated feedforward amplification method and apparatus and, more particularly, to method and apparatus for providing substantially distortion-free amplification of an input signal in overcompensated feedforward amplifier arrangements using overdistorted main amplifiers.

The invention further relates to a method for providing a substantially distortion-free amplification of an input signal in a feedforward amplifier configuration by dividing the input signal into first and second portions, amplifying the first portion to produce a first electrical signal comprising both the amplifier first portion and a distortion component due to the nonlinearity of the amplifier which is greater than would ordinarily be generated, subtracting from the second portion of the input signal a portion of the first electrical signal to produce a second electrical signal, amplifying the second electrical signal, and combining the amplified second electrical signal with the first electrical signal to provide a substantially distortion-free output signal. In contrast to conditions wherein the main amplifier only generates an ordinary distortion component due to its nonlinearity, when the main amplifier is adjusted to introduce a distortion component greater than would ordinarily be generated, (a) a lesser portion of the first electrical signal can be subtracted from the second portion of the input signal thereby permitting relaxed interstage coupler requirements, and/or (b) the amplification requirements for the second electrical signal can be reduced thereby permitting a relaxation of the amplification factor of the auxiliary amplifier.

Other and further aspects of the present invention will become apparent during the course of the following description and by reference to the accompanying drawings.

BRIEF DESCRIPTION OF THE DRAWINGS

Referring now to the drawings, in which like numerals represent like components in the several views.

DETAILED DESCRIPTION

The present invention is primarily described in conjunction with an overcompensating regulating repeater of a repeatered electric wave transmission system. However, it will be understood that such description is exemplary only, and is for purposes of exposition and not for purposes of limitation. It will be readily appreciated that the inventive concept is equally applicable where overcompensated conventional or parallel feedforward amplifier stages are used for any purpose, such as, for example, to compensate for the nonlinear distortion of a preamplifier supplying a signal to the input of the feedforward amplifier.

Figure 1:
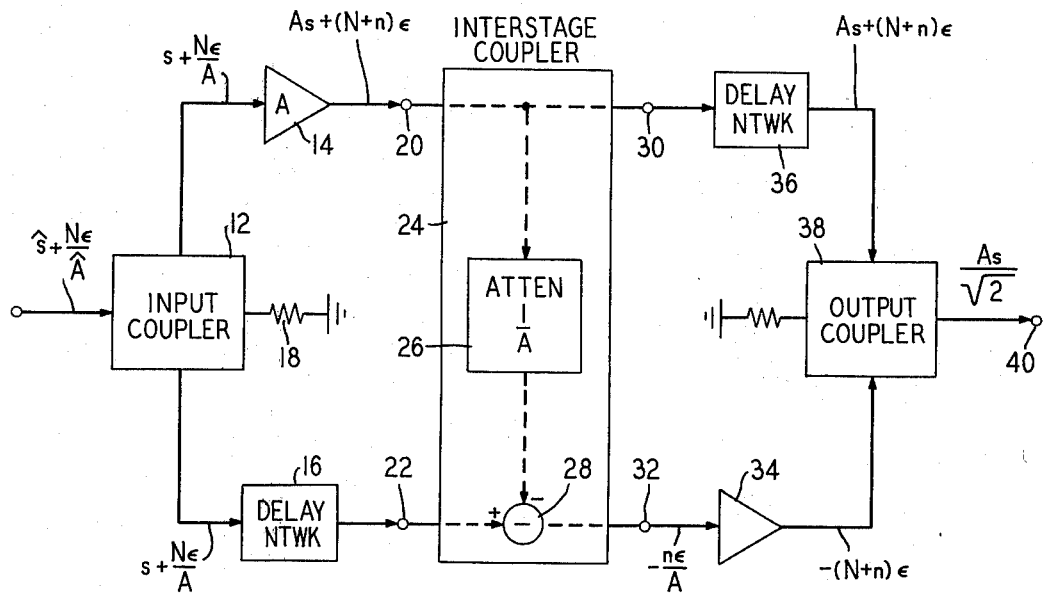
FIG. 1 is a block diagram of an overcompensated conventional feedforward amplifier where distortion cancellation is obtained.

Referring now to the drawings, FIG. 1 shows a prior art overcompensated conventional feedforward amplifier arrangement 10 labeled with generic signal and component formulas to enable the illustration of both the prior art conditions and the improvement achieved in accordance with the present invention. The feedforward amplifier 10 illustrated in FIG. 1 comprises an input coupler 12 having an input signal $\hat{s} + (N\epsilon/\hat{A})$ applied to the input terminal thereof, and a power amplifier 14 and a delay network 16 connected to the conjugate arms of coupler 12. Input coupler 12 may be one of several power-dividing couplers well known in the art; for example, a hybrid coil arrangement or an isolation transformer. As illustrated in FIG. 1, input coupler 12 is a four-port network with two input ports and two output ports, one input port being connected to ground through balancing resistor 18.

The input signal to coupler 12 ($\hat{s} + (N\epsilon/\hat{A})$) is designated as including a linear component s indicative of the input signal to the first basic repeater in a repeatered line having many repeaters, and a distortion component ($N\epsilon/\hat{A}$) indicative of the distortion $\epsilon$ generated in each of the prior number N of basic repeaters to be presently compensated for while accounting for individual repeater gain $\hat{A}$ (or cable loss) of the prior N repeaters. In describing the present invention with reference to an overcompensated conventional feedforward amplifier, it will be assumed that a 3 dB input coupler is employed so that the input signal power will be divided evenly to the two output ports of input coupler 12. Therefore, as shown in FIG. 1, each of the conjugate output arms of coupler 12 will be assumed to have delivered to it a signal having a magnitude of $s + (N\epsilon/A)$. It is well known in the art that the terms designated $\hat{s}$ and $\hat{A}$ of the input signal also must include a factor sufficient to give the input signal an absolute value of $$\sqrt{m^2 + 1}\,(s + \frac{N\epsilon}{A}),$$

where $m$ is the coefficient of input coupler 12 and is equal to 1 for a 3 dB coupler, in order to obtain a signal equal to $s + (N\epsilon/A)$ at each conjugate arm of coupler 12.

The signal at the first output of input coupler 12 is applied to the input of power amplifier 14. Although illustrated as comprising one amplifier stage, power amplifier 14 may comprise a plurality of tandem connected amplifying stages. For purposes of the discussion hereinafter, the overall gain factor of power amplifier 14 is represented as A, the magnitude of which is generally much larger than one. Due to the nonlinearities of power amplifier 14, the output signall of power amplifier 14 consists of an amplified linear signal component As and a distortion component $\eta\epsilon$ produced in response to the input signal s by the nonlinearity of amplifier 14 which is added to the input distortion component $N\epsilon$ produced by the prior N repeaters. Therefore, the output of power amplifier 14 may be represented by the sum of the amplified signal component and the distortion component $As + (N+\eta)\epsilon$.

The signal at the second output of input coupler 12 is applied to a delay network 16. The delay of delay network 16 is chosen to be equivalent to the delay of the signal $s + (N\epsilon/A)$ through amplifier 14 and interstage coupler 26 as is well known by those skilled in the art. Thus, the amplified signal, $As + (N+\eta)\epsilon$, and the delayed signal, $s + (N\epsilon/A)$, at the output of delay network 16 are coincident in time.

The output signal from amplifier 14 and the output signal from delay network 16 are applied to ports 20 and 22, respectively, of an interstage coupler 24. Interstage coupler 24 is a four-port power loss-free network well known in the art as, for example, a hybrid coil arrangement or an isolation transformer. The dotted signal paths and attenuator 26 are only shown to illustrate the functional input-output port relationship and thus do not represent actual signal paths of network components.

As is well known with such interstage coupler, a signal at input port 20 is coupled to output ports 30 and 32. Similarly, the signal at port 22 is coupled to output ports 32 and 30. In accordance with the type of interstage coupler employed in the feedforward amplifier illustrated in FIG. 1, a 180° phase shift is introduced into the signal coupled between ports 20 and 32. If, however, input coupler 12 introduced a 180° phase shift between the signals at the output ports thereof, interstage coupler 24 would not be required to introduce another 180° phase shift. Since it will be assumed that input coupler 12 in FIG. 1 does not introduce a phase shift, interstage coupler 24 is illustrated in FIG. 1 as phase shifting the coupled signal between ports 20 and 32.

As heretofore noted, the signal at port 20 has been amplified by power amplifier 14, the magnitude of which is chosen to be much greater than the unamplified signal at port 22. Furthermore, since the unamplified signal at port 22 is attenuated by attenuator 26 while the coupling between ports 20 and 30 is normally high, the contribution of the coupled unamplified and attenuated signal from port 22 to the coupled amplified signal at port 20 can be assumed to be negligible. Thus, for purposes of the discussion hereinafter, the output signal at port 30 can be solely represented by the direct-coupled unattenuated amplified signal from input port 20, and thus will be assumed to be equal to the signal at port 20. Therefore, the output signal of interstage coupler 24 at output port 30 will be assumed, for purposes of the discussion hereinafter, to be equal to the signal $As + (N+\eta)\epsilon$ at port 20. Since the coupling between ports 22 and 32 has been assumed to be high, the signal at output port 32 may be represented by the difference between the signal at port 22 and the coupled attenuated signal from port 20.

In FIG. 1, interstage coupler 24 is functionally simplified in accordance with the attenuation factors discussed hereinabove by illustrating port 20 as being directly connected to port 30 and to attenuator 26, the attenuation factor of the latter being representative of the coupling factor between ports 20 and 32. Since, as heretofore noted, there is a 180° phase reversal between ports 20 and 32, the output of attenuator 26 is subtracted by subtractor 28 from the signal at port 22 to produce the resulting output signal at port 32. The magnitude of the signal at port 32 is thus determined by the coupling factor of interstage coupler 24 and is represented by the attenuation factor of attenuator 26. Assuming that the attenuation factor of attenuator 26 is equal to $1/A$, then the resulting signal at port 32 will be equal to $-\eta\epsilon/A$.

Output port 32 of interstage coupler 24 is connected to the input of auxiliary power amplifier 34. Auxiliary power amplifier 34 is chosen to have an amplification factor which will amplify the input signal $-\eta\epsilon/A$ in a manner to produce an output signal which is equal in magnitude to $-(N+\eta)\epsilon$. The output signal from auxiliary power amplifier 34 will, therefore, be equal in magnitude but opposite in phase to the distortion component from main amplifier 14 found at port 30 of interstage coupler 24.

The output terminal 30 of interstage coupler 24 is connected to delay network 36. The delay of delay network 36 is chosen to compensate for the delay of the signal at terminal 32 through auxiliary power amplifier 34. The output signal from delay network 36 is thus coinicident in time with the output signal from auxiliary power amplifier 34.

The output of delay network 36, $As + (N+\eta)\epsilon$, and the output of auxiliary power amplifier 34, $-(N+\eta)\epsilon$, are combined in an output coupler 38. Output coupler 38 may be one of several networks well known in the art as, for example, a hybrid coil. If, for example, output coupler 38 is a 3 dB coupler, then the output signal at output terminal 40 will be, as illustrated in FIG. 1, $As/2$. The distortion component of the signal at the output of delay network 36 is cancelled in output coupler 38 by the distortion component at the output of auxiliary power amplifier 34 to produce a substantially distortion-free output signal at output terminal 40.

In prior art conventional feedforward amplifiers where the distortion component $\epsilon$ at each of N uncompensated repeaters is accumulated and then overcompensated for at each N+1 repeater, the input signal to main power amplifier 14 and delay network 16 at the N+1 repeater will have a magnitude of $s + 6\epsilon/A$ when N is equal to 6. The prior art main power amplifier 14 amplifies the input signal by an amplification factor of A and also produces a distortion component of $\epsilon$ due to its nonlinearity which is the same as the distortion component generated by each of the N uncompensating repeaters. Therefore, in prior art conventional feedforward amplifiers, the output signal delivered to ports 20 and 30 of interstage coupler 24 will be $As + (6+1)\epsilon$ or $As + 7\epsilon$ ($\eta$ being equal to 1 in the formula shown in FIG. 1). The signal at port 20 is, in turn, attenuated by a factor of $1/A$ in attenuator 26 of interstage coupler 24 to provide a signal having a magnitude of $s$ 30 $7\epsilon/A$ which is subtracted in subtractor 28 from the signal $s + 6\epsilon/A$ at port 22 to produce a resultant signal having a magnitude of $-\epsilon/A$ at port 32 of interstage coupler 24. The signal at port 32 is amplified in auxiliary power amplifier 34 by an amplification factor of $A(N+1)$, or 7A, to generate an output signal having a magnitude of $-7\epsilon$. It will be recognized that in the embodiment of FIG. 1 no compensation is provided for noise and/or distortion introduced by the subsidiary amplifier 34. Generally, this is not necessary since the subsidiary amplifier is a relatively small, low-power amplifier. As such it inherently has a much lower noise figure than the high-power main amplifier. In addition, being a low-power amplifier, it can readily be designed for high quality performance. The auxiliary amplifier output signal is then combined in output coupler 38 with the signal $As + 7\epsilon$ at port 30 to produce a distortion-free signal $As/\sqrt{2}$ at the output terminal 40.

In accordance with the present invention, it has been found that if the main power amplifier 14 is adjusted to provide a distortion component due to its nonlinearity which is greater than the distortion component generated by each of the N uncompensated repeaters, the amplification factor of auxiliary power amplifier 34 can be reduced by a proportional amount for an advantageous reduction in repeater cost and size. For illustrative purposes, if it is assumed that the feedforward amplifier shown in FIG. 1 is overcompensating for 6 uncompensating repeaters (N=6) and that main power amplifier 14 is adjusted to generate a distortion component $\epsilon$ due to its nonlinearity which is three times that normally generated by each of the N uncompensating repeaters ($\eta$=3), then the signal delivered to ports 20 and 30 of interstage coupler 24 will be equal to $As + 9\epsilon$. The signal at port 20 will be attenuated in attenuator 26 to provide a signal having a magnitude of $s + 9\epsilon/A$ which is subtracted from the signal $s + 6\epsilon/A$ at port 22 to produce a resultant signal at port 32 having a magnitude of $-3\epsilon/A$. In accordance with the present invention, auxiliary power amplifier 34 need only have an amplification factor of $$\frac{A(N+\eta)}{\eta},$$

or 3A, to generate an output signal of $-9\epsilon$, which signal can be combined in output coupler 38 with the signal at port 30 to provide a substantially distortion-free signal at output terminal 40. Therefore, by overdistorting the main power amplifier 14 in an overcompensation conventional feedforward amplifier by a factor which is three times the distortion normally produced, the amplification factor of the auxiliary power amplifier can be reduced from 7A to a value of 3A.

Figure 2:
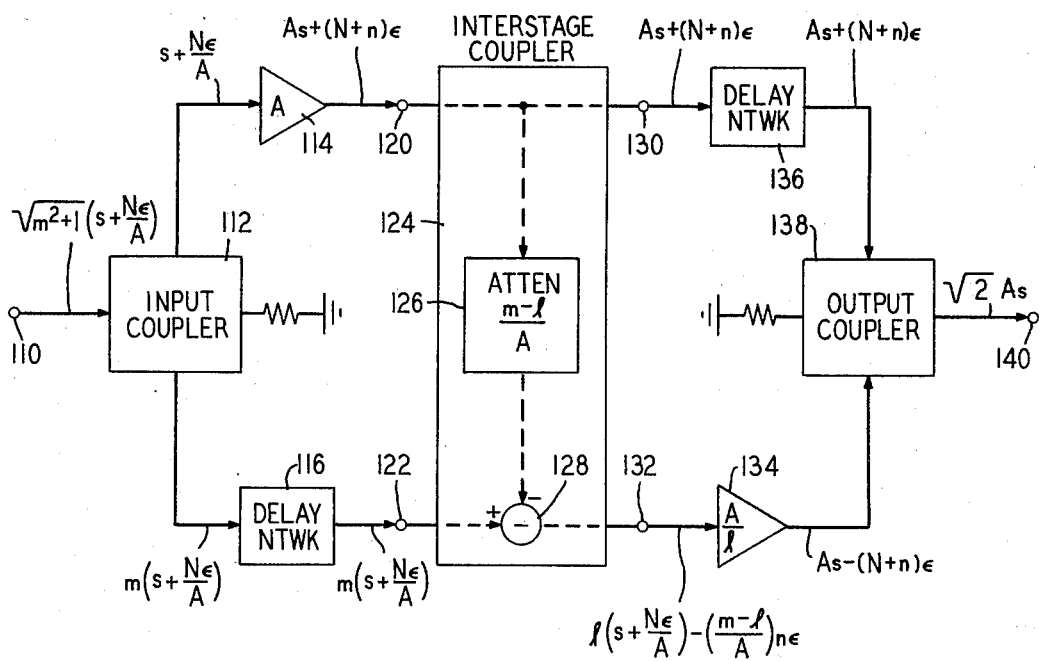
FIG. 2 is a block diagram of an overcompensated parallel feedforward amplifier wherein both distortion cancellation and increased power output are obtained.

FIG. 2 shows a prior art overcompensated parallel feedforward amplifier 100, having components similarly arranged to the overcompensated conventional feedforward amplifier 10 of FIG. 1. The feedforward amplifier 100 of FIG. 2 is labeled with generic signal and component formulas to enable the illustration of both the prior art conditions and the improvements according to the present invention. Although the parallel feedforward amplifier 100 and conventional feedforward amplifier 10 appear to be similar, the parallel feedforward amplifier 100 substantially reduces or cancels the distortion generated by both the main power amplifier and the N uncompensating repeaters connected to the input thereof, while providing an output having a substantially greater signal power than found with the conventional feedforward amplifier 10 or other prior art low-distortion amplifiers.

As shown in FIG. 2, an input signal is applied at input terminal 110 to an input coupler 112. Input coupler 112 may be one of several power dividing couplers as described for input coupler 12 of FIG. 1. In order for one of the output-coupled signals from input coupler 112 to have a unitary coefficient, the input signal at terminal 110 is represented by $$\sqrt{m^2 + 1} \; (s + \frac{N\epsilon}{A}),$$

where $s$ is a time varying signal. The output signals can thus be made to be $s + N\epsilon/A$ and $m(s+N\epsilon/A)$, respectively. The coefficient $m$ is determined by the selection of input coupler 112. For example, if a 10 dB input coupler is employed, $m$ is equal to 3. Similarly, if a 3 dB input coupler is employed, $m$ is equal to 1, and the input signal power would be divided evenly to the two output ports of input coupler 112. The signal $s + N\epsilon/A$ is applied to a power amplifier 114 where the signal is amplified by a factor A to produce the signal As + $(N+\eta)\epsilon$ at input port 120 and output port 130 of interstage coupler 124. The signal at port 120 is attenuated in attenuator 126 of interstage coupler 124 by an attenuation factor of m-l/A and subtracted from the signal $m(s+N\epsilon/A)$, appropriately delayed by delay network 116, in subtractor 128 of interstage coupler 124. The resultant signal $$l\left[s + \frac{N\epsilon}{A}\right] - \left[\frac{m-l}{A}\right]\eta\epsilon$$

from subtractor 128 at output port 132 is applied to auxiliary power amplifier 134 where the resultant signal is amplified by an amplification factor of A/l to generate an output signal having a magnitude of As − $(N+\eta)\epsilon$. The output signal As − $(N+\eta)\epsilon$ is combined in output coupler 138 with the signal As + $(N+\eta)\epsilon$ at port 130, and appropriately delayed by delay network 136, to provide a signal having a magnitude of 2As at output terminal 140.

In order to determine values and the interrelationship between $m$, $l$ and $n$, let the distortion generated by auxiliary amplifier 134 be $\epsilon$. The distortion at the output of auxiliary amplifier 134 will, therefore, be $$\frac{A}{l} l \left[\frac{N\epsilon}{A}\right] - \frac{A}{l} \; \frac{m-l}{A} \eta\epsilon + \epsilon \qquad (1)$$

which can be reduced to $$(N + 1)\epsilon - \frac{m-l}{l}\eta\epsilon. \qquad (2)$$

The distortion in the main path at ports 120 and 130 is $(N+\eta)\epsilon$. Thus $m$, $l$ and $\eta$ has to be chosen such that $$(N + 1)\epsilon - (\frac{m-l}{l})\eta\epsilon = -(N + \eta)\epsilon \qquad (3)$$

which can be reduced to $$\eta = \left[\frac{l}{m - 2l}\right]\left[2N + 1\right], \qquad (4)$$

Equation (4) governing the relationship of $m$, $l$ and $\eta$.

Figure 3:
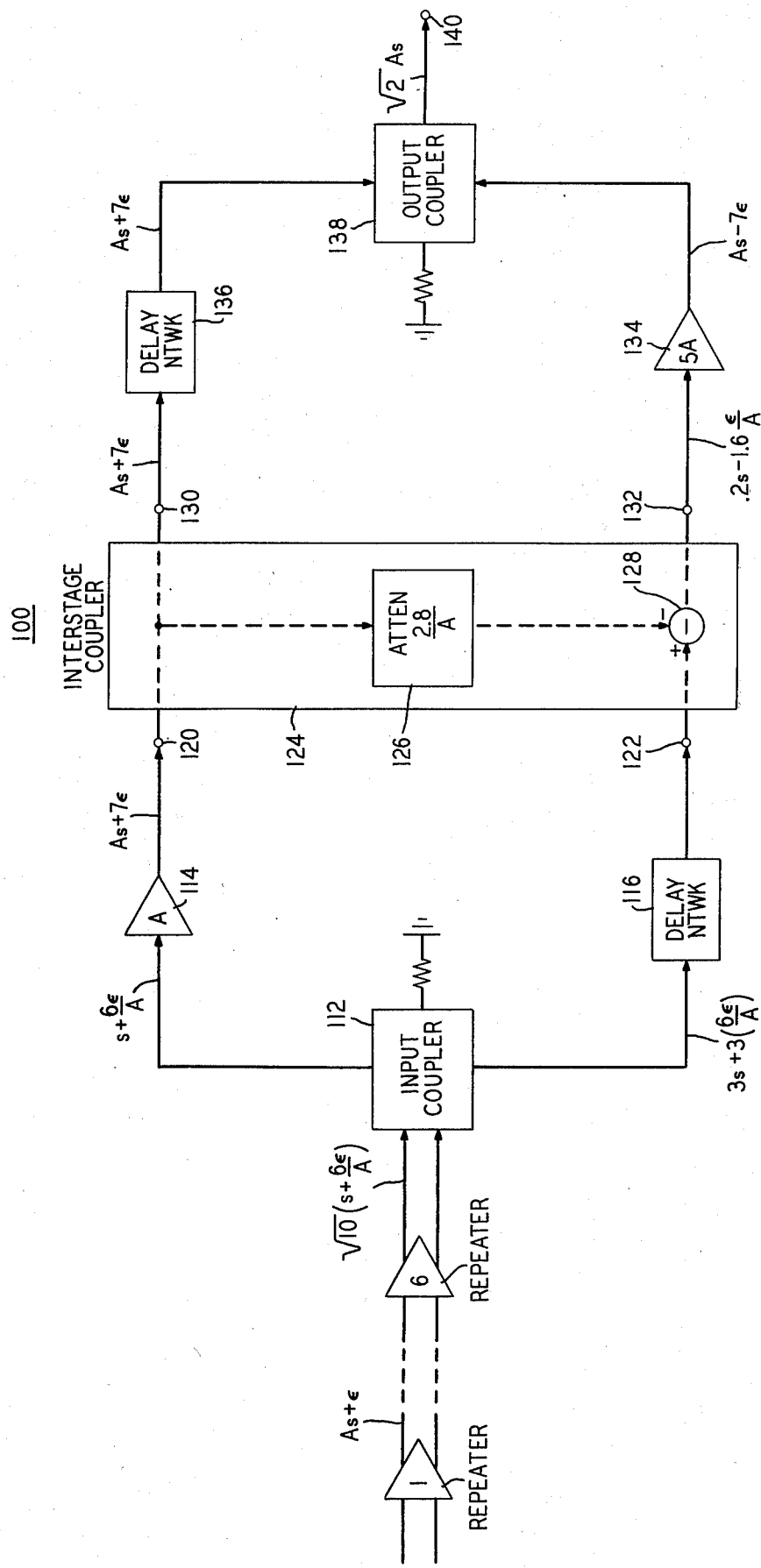
FIG. 3 is a block diagram of the overcompensated parallel feedforward amplifier of FIG. 2 including typical parameters found in the prior art for the various components.

FIG. 3 shows the overcompensated parallel feedforward amplifier 100 of FIG. 2 for a special case, as can be found in the prior art, where $\eta=1$ (main power amplifier 114 generates a distortion component $\epsilon$ approximately equal to the distortion component of each of the N uncompensating repeaters), N=6, and $m=3$ (a 10 dB input coupler 112). By substituting these conditions in Equation (4) above, $l$ can be found to be equal to a value of 0.2. Therefore, in FIG. 3, attenuator 126 will have an attenuation factor of 2.8/A and auxiliary power amplifier 134 will have a gain of 5A.

With the above-mentioned conditions imposed, the output signal As + 7$\epsilon$ at main power amplifier 114 is attenuated by a factor of 2.8/A in attenuator 126 and subtracted in subtractor 128 from the delayed signal 3s + 18$\epsilon$/A at port 122 to produce the signal 0.2s − 1.6$\epsilon$/A at port 132. Auxiliary power amplifier 134 amplifies the signal at port 132 by a factor of 5A to generate a signal having a magnitude of As − 8$\epsilon$ + $\epsilon$ (where +$\epsilon$ is the distortion component generated in auxiliary amplifier 134 due to its nonlinearity) or As − 7$\epsilon$. The output signal As − 7$\epsilon$ from auxiliary amplifier 134 is combined in output coupler 138 with the delayed output signal As + 7$\epsilon$ from main power amplifier 114 to produce a distortion-free signal at output terminal 140.

Figure 4:
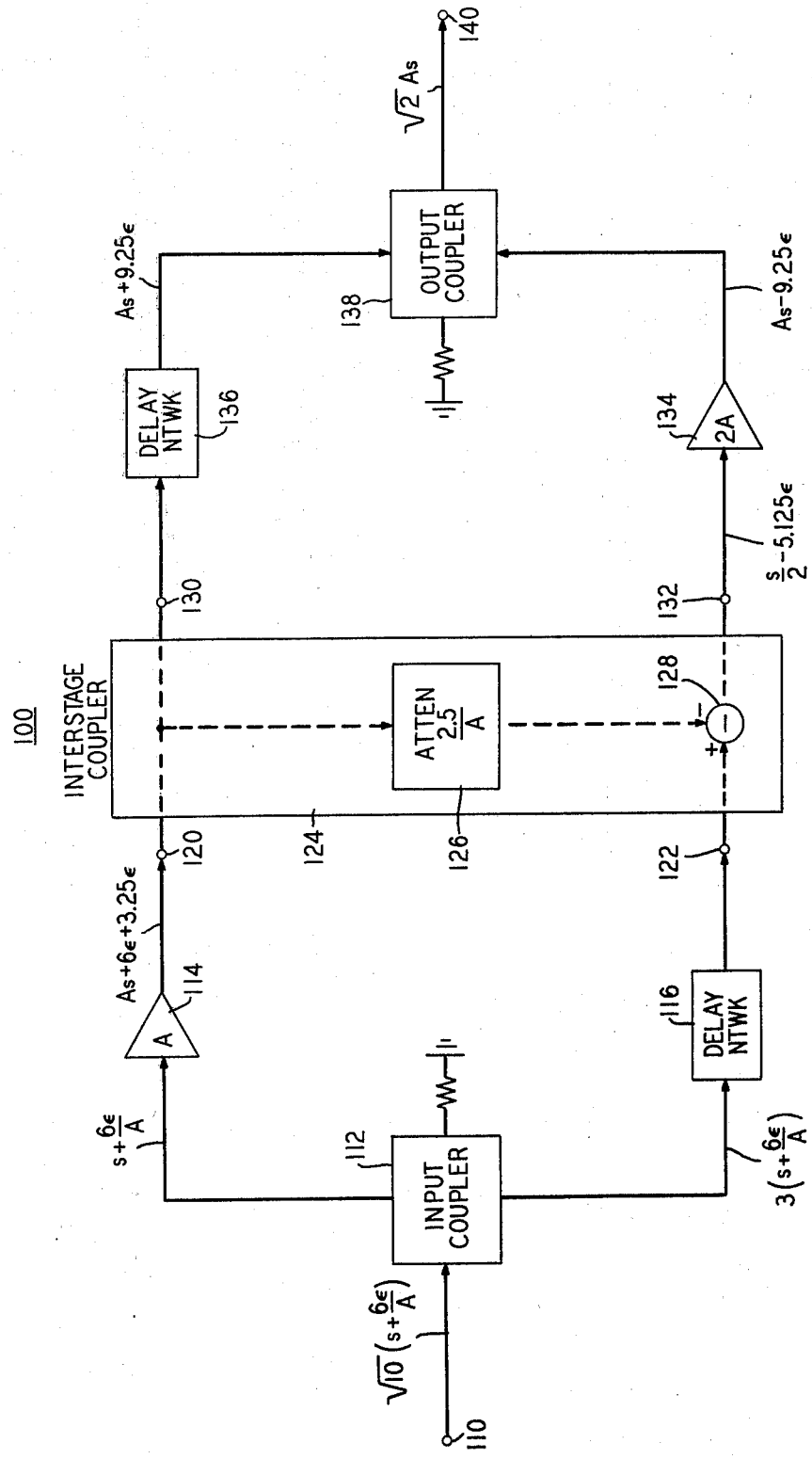
FIG. 4 is a block diagram of the overcompensated parallel feedforward amplifier of FIG. 2 including typical parameters for the various components in accordance with the present invention.

FIG. 4 illustrates conditions similar to that shown in FIG. 3, except that the main power amplifier 114 is adjusted to generate a distortion component due to its nonlinearity, in accordance with the present invention, which is greater than the distortion component normally generated by each of the N uncompensating repeaters and main power amplifier 114 of FIG. 3. In FIG. 4 it has been assumed that N=6 and $m$=3, as assumed for the arrangement of FIG. 3, but in accordance with the present invention, $\eta$ will be assumed to equal 3.25. Under such conditions, and as shown in FIG. 4, main power amplifier 114 will generate a signal As + 6$\epsilon$ + 3.25$\epsilon$, or As + 9.25$\epsilon$, which is attenuated in attenuator 126 by a factor of only 2.5/A and subtracted in subtractor 128 from the appropriately delayed signal 3s + 18$\epsilon$/A at port 122 to produce a signal s/2 − 5.125$\epsilon$ at port 132. The signal at port 132 need only be amplified by a factor of 2A in auxiliary amplifier 134 to produce an amplifier output signal of As − 10.25$\epsilon$ + $\epsilon$ or As − 9.25$\epsilon$ which when combined in output coupler 138 with the appropriately delayed signal As + 9.25$\epsilon$ at port 130 will produce a distortion-free signal $\sqrt{2As}$ at output terminal 140.

By overdistorting main power amplifier 114 in accordance with the present invention, the value of $l$ has effectively been proportionally increased thereby permitting a reduction of the attenuation factor of attenuator 126 and the amplification factor of auxiliary power amplifier 134.

The ability to relax the attenuation factor of attenuator 126 and the amplification factor of auxiliary amplifier 134 permits an advantageous reduction in repeater cost and size.

The above-described arrangements are illustrative of the application of the principles of the invention. Other embodiments may be devised by those skilled in the art without departing from the spirit and scope thereof. For example, it is also within the spirit and scope of the present invention to compensate for any nonlinear distortions which are introduced by a preamplifier (not shown) and included in the signal arriving at the input terminals of the arrangements of FIGS. 1–4. However, as is known to those skilled in the art, when compensating for preamplifier generated nonlinear distortion values which are in phase with the distortions from the N prior repeaters, it is necessary to slightly modify the attenuation value of interstage coupler 24 or 124 and the amplification factor of auxiliary amplifier 34 or 134. When compensating for preamplifier generated nonlinear distortion values which are not in phase with the distortions from the N prior repeaters, then the phase and amplitude differences must be cancelled out by modifying input coupler 12 or 112, interstage coupler 24 or 124, and auxiliary amplifier 34 or 134 as is well known in the art.

What is claimed is:

1. A method for providing a substantially distortion-free amplification of an input signal comprising at least a distortion-free component in a feedforward amplifier configuration, comprising the steps of:
   a. dividing the input signal into a first and a second portion;
   b. amplifying the first portion of the input signal in a first amplifier adjusted to produce a first electrical signal comprising both the amplified first portion of the input signal and a distortion component due to the nonlinearity of said first amplifier which is greater than normally generated by said first amplifier;
   c. subtracting from said second portion of the input signal a portion of said first electrical signal to produce a second electrical signal;
   d. amplifying said second electrical signal in a second amplifier to provide a third electrical signal comprising a distortion component which is substantially equal and opposite in phase to the overall distortion component of said first electrical signal; and
   e. combining said first and said third electrical signals to provide an output signal comprising an amplification of only the distortion-free component of the input signal.

2. A feedforward amplifier configuration for providing a substantially distortion-free amplification of an input signal, comprising:
   first and second amplifier means, said first amplifier means being adjusted to generate distortion characteristics due to the nonlinearity of said first amplifier means which are greater than normally produced by such amplifier means; a first and a second delay network means each having an input terminal and an output terminal; an input coupler means for coupling to an input of said first amplifier means a portion of said input signal and for coupling the remaining portions of said input signal to the input terminal of said first delay network; a fourport interstage coupling means for coupling a signal at the output of said first amplifier means substantially unaltered to the input terminal of said second delay network means and for coupling both a portion of the output signal from said first amplifier means and the signal at the output terminal of said first delay network means to the input of said second amplifier means; and output coupling means for developing an output signal by combining signals at the output terminal of said second delay network means with the output of said second amplifier means, the phase characteristics of said input coupling means and said interstage coupling means being arranged such that the phase of the distortion components at the output of said second amplifier means is opposite the phase of the distortion components at the output of said first amplifier means.

3. A feedforward amplifier configuration as defined in claim 2, wherein
   said second amplifier means is adjusted to provide a smaller amplification factor than would normally be provided under conditions where said first amplifier means is adjusted to introduce a normal amount of nonlinear distortion when said first amplifier means is adjusted to introduce said greater-than-normal nonlinear distortion characteristics.

4. A feedforward amplifier configuration as defined in claim 3, wherein
   said four-port interstage coupling means is adjusted to couple a smaller portion of the output signal from said first amplifier means to the signal at the output terminal of said first delay network means than would normally be provided under conditions where said first amplifier means is adjusted to introduce a normal amount of nonlinear distortion when said first amplifier means is adjusted to generate said greater-than-normal nonlinear distortion characteristics.

5. A feedforward amplifier configuration comprising:
   an input terminal for receiving an applied input signal comprising a linear component and a distortion component;
   two signal paths, the first of said signal paths including in cascade a main amplifier and a first delay line, said main amplifier being adjusted to introduce a signal distortion due to the nonlinearity of said main amplifier which is greater than normally introduced by such main amplifier, the second of said signal paths including in cascade a second delay line and an auxiliary amplifier, said auxiliary amplifier being adjusted to introduce a signal distortion due to the nonlinearity of said auxiliary amplifier which is normally introduced by such auxiliary amplifier;
   first coupling means connecting said input terminal with said first signal path and said second signal path, said first coupling means being capable of coupling a portion of an applied input signal to said first signal path and the remaining portion of said applied input signal to the said second signal path;
   second coupling means connecting the outputs of said main amplifier and said second delay line with the inputs of said first delay line and said auxiliary amplifier, said second coupling means being capable of coupling to the input of said auxiliary amplifier at least a portion of the output of said main amplifier and the output of said second delay line in a manner that the phase relationship between